(12) United States Patent  
Banerjee et al.

(10) Patent No.: US 8,589,750 B2
(45) Date of Patent: Nov. 19, 2013

(54) METHODS AND APPARATUS FOR PROVIDING A BUILT-IN SELF TEST

(75) Inventors: Gaurab Banerjee, Karnataka (IN); Manas Behera, Austin, TX (US); Kenneth Charles Barnett, Austin, TX (US)

(73) Assignee: QUALCOMM, Incorporated, San Diego, CA (US)

( * ) Notice: Subject to any disclaimer, the term of this patent is extended or adjusted under 35 U.S.C. 154(b) by 270 days.

(21) Appl. No.: 12/836,462

(22) Filed: Jul. 14, 2010

(65) Prior Publication Data

US 2012/0017131 A1    Jan. 19, 2012

(51) Int. Cl.
*H03M 13/00* (2006.01)

(52) U.S. Cl.
USPC ........................................ 714/733

(58) Field of Classification Search
USPC ........... 714/30–36, 37, 38.1, 45, 46, 47.1, 48, 714/721, 733–742
See application file for complete search history.

(56) References Cited

U.S. PATENT DOCUMENTS

| | | | |
|---|---|---|---|
| 5,805,605 A * | 9/1998 | Lee et al. | 714/718 |
| 6,738,940 B1 | 5/2004 | Hummel et al. | |
| 7,872,645 B2 * | 1/2011 | Myers | 345/207 |
| 2005/0057271 A1 * | 3/2005 | Olleta et al. | 324/765 |
| 2009/0134904 A1 | 5/2009 | Zjajo et al. | |
| 2010/0007366 A1 | 1/2010 | Watanabe et al. | |
| 2010/0293426 A1 * | 11/2010 | Dasnurkar | 714/733 |
| 2011/0273197 A1 * | 11/2011 | Banerjee et al. | 324/750.3 |

FOREIGN PATENT DOCUMENTS

WO    2011140563    11/2011

OTHER PUBLICATIONS

Garcia A.V., et al., "Built-in Self Test of RF Transceiver SoCs: from Signal Chain to RF Synthesizers", Radio Frequency Integrated Circuits (RFIC) Symposium, 2007 IEEE, IEEE, Piscataway, NJ, USA, Jun. 1, 2007, pp. 335-338, XP031113042, ISBN: 978-1-4244-0530-5.
International Search Report and Written Opinion—PCT/US2011/043915—ISA/EPO—Dec. 12, 2011.

* cited by examiner

*Primary Examiner* — Nadeem Iqbal
(74) *Attorney, Agent, or Firm* — William M. Hooks

(57) ABSTRACT

A built-in self test (BiST) system is described. The BiST system includes a circuit-under-test. The BiST system also includes one or more embedded sensors. Each of the embedded sensors includes one or more switches connected to one or more nodes within the circuit-under-test. The BiST system further includes a signal generator. The BiST system also includes a bus interface. The bus interface provides for external access of the BiST system.

33 Claims, 12 Drawing Sheets

METHODS AND APPARATUS FOR PROVIDING A BUILT-IN SELF TEST

TECHNICAL FIELD

The present disclosure relates generally to electronic devices for communication systems. More specifically, the present disclosure relates to systems and methods for providing a built-in self test.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. Testing may be used to verify or test various parts of devices, such as pieces of hardware, software or a combination of both.

In many cases the equipment used to test a device is a separate piece of equipment than the device being tested. Some testing that takes place is performed substantially by the test equipment. Benefits may be realized by providing improved methods and apparatus for providing built-in self tests for electronic devices and/or components used in electronic devices.

DETAILED DESCRIPTION

Figure 1:
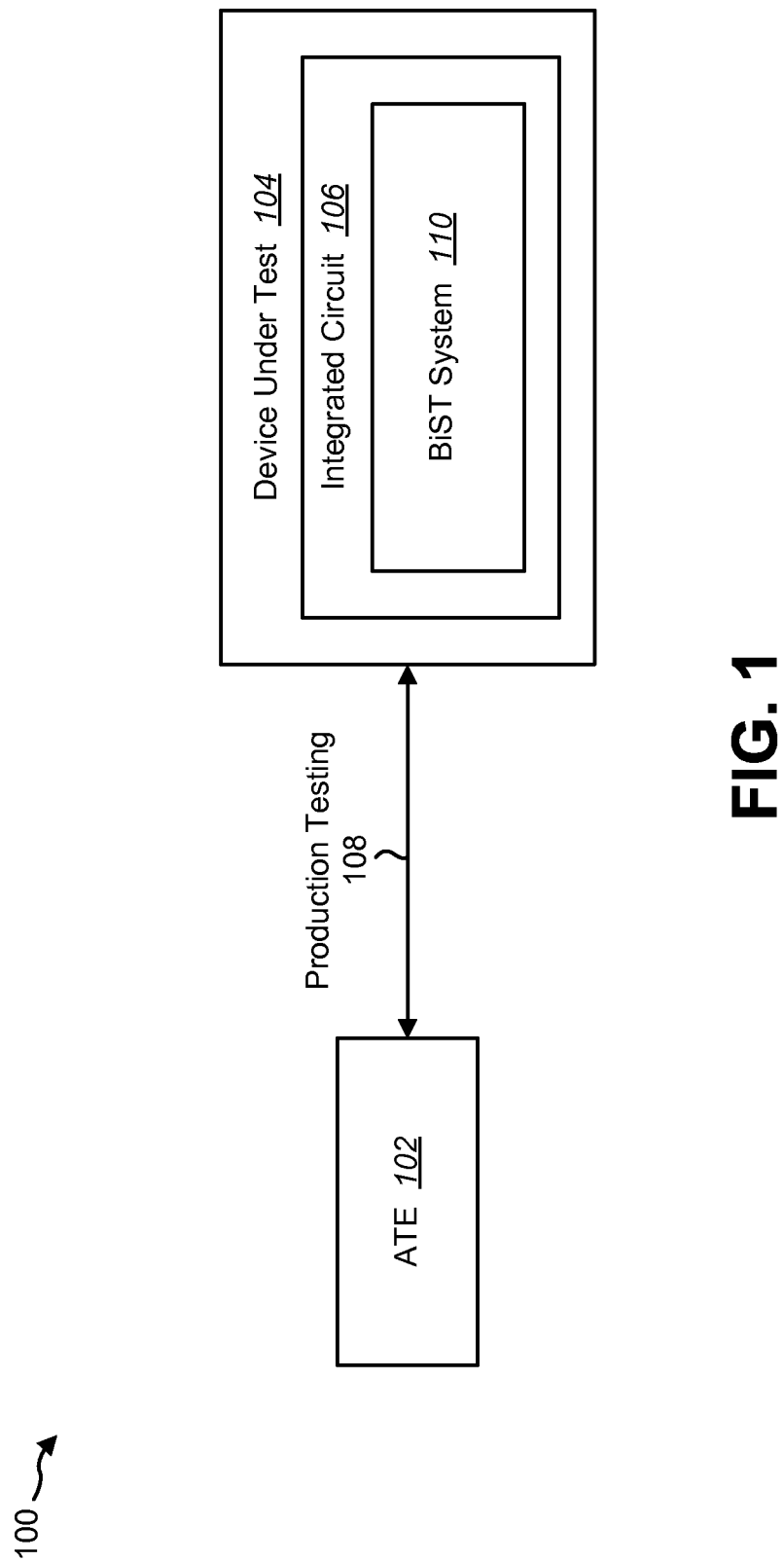
FIG. 1 shows a system for production testing of a device under test (DUT) with mixed signal circuitry.

A built-in self test (BiST) system is described. The BiST system includes a circuit-under-test. The BiST system also includes one or more embedded sensors, that each include one or more switches connected to one or more nodes within the circuit-under-test. The BiST system further includes a signal generator. The BiST system also includes a bus interface that provides for external access of the BiST system.

The BiST system may include an on-chip analog-to-digital converter (ADC). Outputs from the ADC may be provided to automatic test equipment (ATE) via the bus interface. A switch may provide a connection between a node within the circuit-under-test and the ADC. A measurement may be taken of the node within the circuit-under-test when the switch is in the closed or 'on' position. The BiST system may also include an envelope detector between the switch and the ADC that converts a measured signal response to an equivalent direct current (DC) level.

A switch may provide a connection between the signal generator and a node within the circuit-under-test. A signal generated by the signal generator may be applied to the node within the circuit-under-test when the switch is in the closed or 'on' position. The switches may be controlled by a register. The BiST system may include an analog bus. The BiST system may include a digital bus.

A method for providing a built-in self test (BiST) is described. A signal response of a circuit-under-test is measured using a first switch in an embedded sensor that includes one or more switches connected to one or more nodes within the circuit-under-test. The measured signal response is converted to a digital signal using an analog-to-digital converter (ADC). The digital signal is provided to automatic testing equipment (ATE).

A testing procedure may be determined for the circuit-under-test. A probe signal may be generated according to the testing procedure. The probe signal may be applied to the circuit-under-test using a second switch in the embedded sensor. A circuit may be selected as the circuit-under-test. An address for the circuit-under-test may be determined. The address for the circuit-under-test may be loaded into a register. The contents of the register may be applied to the embedded sensor on the circuit-under-test.

Digital logic for the one or more switches may be determined that includes instructions for opening or closing each of the one or more switches. The digital logic may be loaded into a register. The digital logic may be applied to the one or more switches. The measured signal response may be converted to equivalent DC levels using an envelope detector. The digital signal may be processed using a finite state machine.

The processed digital signal may be correlated with external measurements. The digital signal may be provided to the ATE via a digital bus and a bus interface. The probe signal may be applied to the circuit-under-test via an analog bus. The probe signal may be generated using a radio frequency (RF) synthesizer. The ATE may be a digital ATE.

A wireless device configured for providing a built-in self test (BiST), is also described. The wireless device includes a processor, memory in electronic communication with the processor and instructions stored in the memory. The instructions are executable by the processor to measure a signal response of a circuit-under-test using a first switch in an embedded sensor that includes one or more switches connected to one or more nodes within the circuit-under-test. The instructions are also executable by the processor to convert the measured signal response to a digital signal using an analog-to-digital converter (ADC). The instructions are further executable by the processor to provide the digital signal to automatic testing equipment (ATE).

An apparatus for providing a built-in self test (BiST) is described. The apparatus includes means for measuring a signal response of a circuit-under-test using a first switch in an embedded sensor that includes one or more switches connected to one or more nodes within the circuit-under-test. The apparatus also includes means for converting the measured signal response to a digital signal using an analog-to-digital converter (ADC). The apparatus further includes means for providing the digital signal to automatic testing equipment (ATE).

A computer-program product for a wireless device configured for providing a built-in self test (BiST) is described. The computer-program product includes a computer-readable medium having instructions thereon. The instructions include code for measuring a signal response of a circuit-under-test using a first switch in an embedded sensor that includes one or more switches connected to one or more nodes within the circuit-under-test. The instructions also include code for converting the measured signal response to a digital signal using an analog-to-digital converter (ADC). The instructions further include code for providing the digital signal to automatic testing equipment (ATE).

Many different kinds of electronic devices may benefit from testing. Different kinds of such devices include, but are not limited to, cellular telephones, wireless modems, computers, digital music players, Global Positioning System units, Personal Digital Assistants, gaming devices, etc. One group of devices includes those that may be used with wireless communication systems. As used herein, the term "mobile station" refers to an electronic device that may be used for voice and/or data communication over a wireless communication network. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc.

A wireless communication network may provide communication for a number of mobile stations, each of which may be serviced by a base station. A base station may alternatively be referred to as an access point, a Node B, or some other terminology. Base stations and mobile stations may make use of integrated circuits with mixed signal circuitry. However, many different kinds of electronic devices, in addition to the wireless devices mentioned, may make use of integrated circuits with mixed signal circuitry. Production of integrated circuits may result in process variations that affect the operation of the mixed signal circuitry. Accordingly, a broad array of electronic devices may benefit from the systems and methods disclosed herein.

Production testing of semiconductor devices typically involves the optimization of maintaining test quality to ensure a low defect rate in the final product while minimizing the overall test cost. Various matrices may be defined for test quality and the corresponding defect rates, which need to be adhered to with the available resources. Low cost testers have been developed in order to reduce test costs by downgrading Automatic Test Equipment (ATE) hardware resources. Providing voltage and timing resources for each pin on an ATE is one factor driving up the cost of ATE systems.

Some lower-cost ATEs attempt to minimize per pin hardware and provide a limited number of resource intensive pins for running hardware intensive tests. This approach may add constraints to test board design as well as multi-site testing, as the limited number of ATE resources may need to be allocated to multiple device-under-test (DUT) pins. With a BiST scheme, lower-cost ATEs may be sufficient for analog testing, which can substantially reduce the cost of testing.

Parallel testing has been enabled earlier in the product development cycle. Quad (or N-site) testing can be enabled when only power/ground and temperature compensated crystal oscillator (TCXO) connections are required. This can also substantially reduce test-cost. In the disclosed BiST scheme, a reduction in mixed-signal test time has been achieved by using a digital approach, wherein only power/ground and TXCO connections may be used. This allows multi-site testing of analog and mixed signal circuits since the approach is digital.

The high-volume testing of analog and radio frequency (RF) integrated circuits may require the use of external instrumentation with high accuracy. However, access issues with such instrumentation may increase the test time. Furthermore, a limited number of nodes can be probed for parameters of interest. The use of a BiST scheme may reduce both the test time and the resulting product development cost.

An on-chip housekeeping analog-to-digital converter (ADC) may be used for a multitude of housekeeping operations to provide a fully digital output. An on-chip ADC may be present on a large percentage of System on a Chip (SoC) and System in a Package (SiP) modules. The BiST scheme may employ an interval-sampling scheme for high data rates that an on-chip ADC may not have the ability to handle. The statistical parameters of a Gaussian distribution may be verified to ensure that no information is lost and no artifacts are created by the BiST scheme. By reusing housekeeping ADCs and microprocessors (such as ARM) cores, the BiST scheme can be enabled without additional area requirements on the chip. Such a piggybacked operation may save die area on the chip.

FIG. 1 shows a system 100 for production testing 108 of a device under test (DUT) 104 with mixed signal circuitry. In one configuration, the DUT 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry. Examples of integrated circuits that may be tested include baseband filters, amplifiers, mixers, phase locked loops (PLLs), oscillators, data convertors, and bandpass filters.

The cost of testing mixed signal circuitry with a conventional analog-stimulus may be much higher than the cost of testing digital circuitry due to the higher cost of automated testing equipment (ATE) 102 required for analog stimulus generation. Multiple variants of low cost testers have been developed for digital testing which rely on relaxed timing, power or tester channel requirements to lower hardware costs. An ATE 102 may be unable to test integrated circuits 106 including mixed-signal/RF components due to the limitations of such ATE 102: the lack of analog/RF stimulus and measurement modules. Analog blocks are increasingly common on digital Application Specific Integrated Circuits (ASICs), System on a Chip (SoC) and System in a Package (SiP) modules.

A digital ATE 102 may enable full production-quality testing 108 of integrated circuits 106 by using a Built-in Self Testing (BiST) system 110. The BiST system 110 may use a distributed network of sensors embedded on the integrated circuit 106 to perform measurements for parameters of interest. For example, the sensors may measure direct current (DC) and RF/alternating current (AC) amplitudes. The sensors may be connected to various blocks of interest within the integrated circuit 106 such as a low noise amplifier (LNA), a mixer, etc. The sensors may make measurements on the integrated circuit 106 at one or more internal nodes. The BiST system 110 may provide a fully digital output to ensure compatibility with non-analog low-cost ATE 102 and the ability to potentially reuse some of the hardware that the SoC/SiP may already have. The BiST system 110 may use on-die signal generation and data conversion.

The data measured by the sensors may be correlated by an ATE 102 with data gathered from external high-accuracy measurements. Once the two types of data have been correlated, the BiST based measurements may be used to determine if the integrated circuit 106 passes or fails certain figures of merit. It may then be determined whether the DUT 104 can be shipped to customers. Once BiST based tests are correlated to ATE based tests, a significant reduction in test time may be expected, due to the parallel nature of on-chip BiST based testing.

Figure 2:
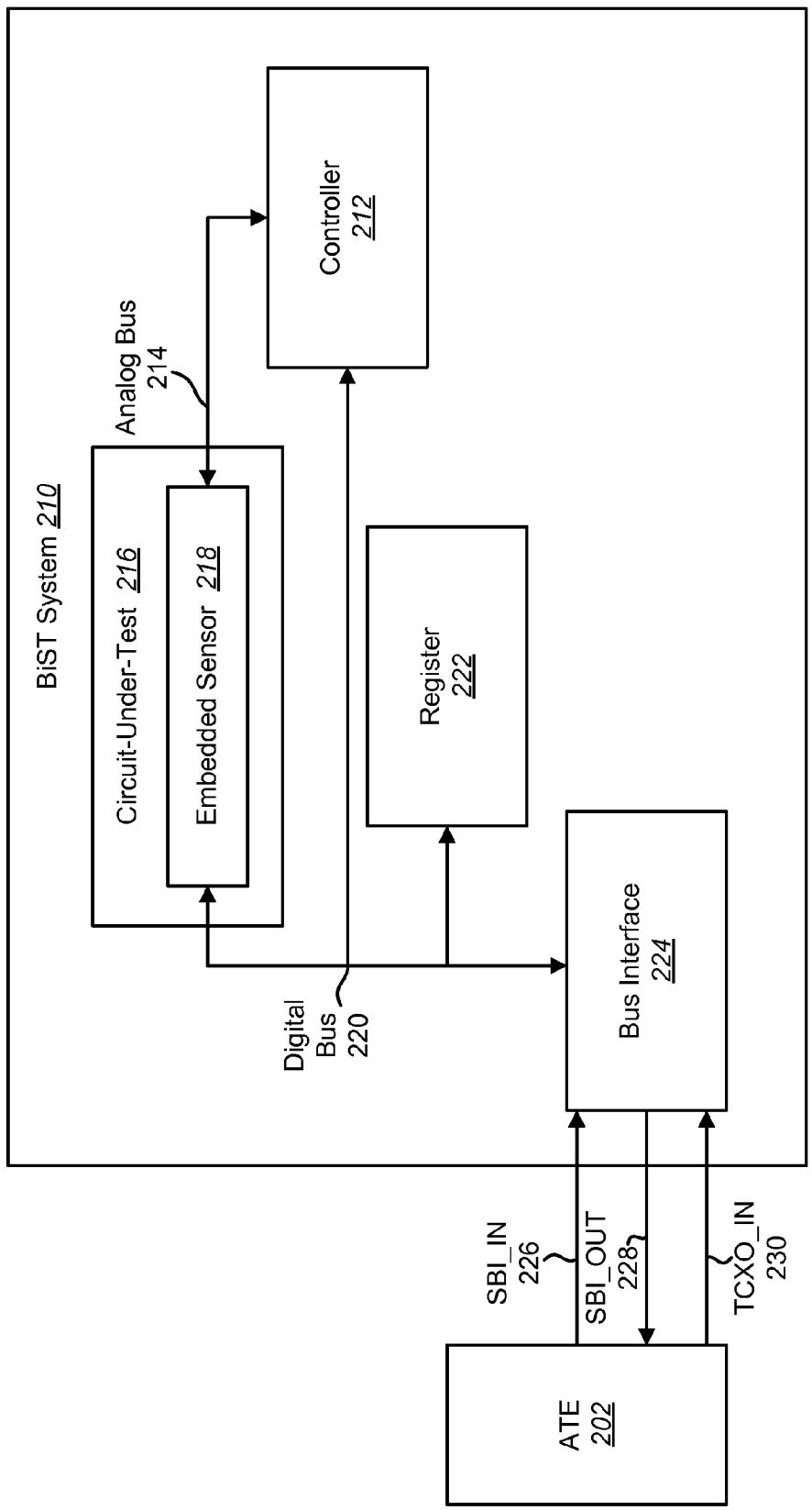
FIG. 2 is a block diagram illustrating various components of one configuration of a built-in self test (BiST) system.

FIG. 2 is a block diagram illustrating various components of one configuration of a BiST system 210. The BiST system 210 of FIG. 2 may be one example of the BiST system 110 of FIG. 1. Access to the BiST system 210 may be accomplished through a bus interface 224. The bus interface 224 may be a serial bus interface (SBI). An ATE 202 may send an SBI_IN 226 signal to the BiST system 210 and receive an SBI_OUT 228 signal from the BiST system 210. A clocking signal such as a temperature compensated crystal oscillator (TCXO) may be provided to the BiST system 210 through a TCXO_IN 230. SBI_IN 226, SBI_OUT 228, and TCXO_IN 230 may all be provided to the BiST system 210 through the bus interface 224. Thus, changes to the existing input/output (I/O) scheme of the integrated circuit 106 may be unnecessary.

The bus interface 224 may provide access to a digital bus 220. The digital bus 220 may be a standard feature on a DUT 104. For example, a digital bus 220 is typically used in analog and mixed signal protocols. The digital bus 220 may provide digital logic for a register 222 and a controller 212 on the BiST system 210. The digital bus 220 may also provide digital logic for one or more embedded sensors 218. Each embedded sensor 218 may be placed on a circuit-under-test 216. The circuit-under-test 216 may be a portion of the integrated circuit 106 on the DUT 104. Each embedded sensor 218 may receive controlling instructions via the digital bus 220. For example, the digital bus 220 may put each embedded sensor 218 into a specific state. Each embedded sensor 218 may include one or more switches. Each switch may determine the connection between the embedded sensor 218 and the circuit-under-test 216. For example, a switch in the 'on' position may indicate that a particular node on the circuit-under-test 216 is to be probed with a particular voltage. As another example, a switch in the 'on' position may indicate that a measurement is to be taken of a particular node in the circuit-under-test 216.

The register 222 may send instructions to the embedded sensors 218 through the digital bus 220. For example, the register 222 may instruct each embedded sensor 218 to turn certain switches to 'on' and 'off' positions. The register 222 may send digital instructions to each embedded sensor 218 according to the specific tests performed on the circuit-under-test 216.

The register 222 may also communicate with the embedded sensors 218 through an analog bus 214. The analog bus 214 may be a standard feature on the DUT 104.

The BiST system 210 may include a controller 212. The controller 212 may control the BiST system 210. For example, the controller 212 may be a central controller for the BiST system 210. A single controller 212 may be used to control multiple embedded sensors 218 on multiple circuits-under-test 216. The controller 212 may be used to control the register 222. The controller 212 may receive instructions from the ATE 202 via the SBI_IN 226, the bus interface 224, and the digital bus 220. For example, the controller 212 may receive instructions concerning which tests are to be performed on a circuit-under-test 216. The controller 212 may also receive instructions identifying the circuit-under-test 216. For example, the controller 212 may receive the address of the circuit-under-test 216. The controller 212 may also be used to control each of the embedded sensors 218. The controller 212 may communicate with the embedded sensors 218 through an analog bus 214. An analog bus 214 is typically used in analog and mixed signal protocols. The controller 212 may generate probe signals for the circuit-under-test 216 and send these probe signals to the circuit-under-test 216 via the embedded sensors 218 and the analog bus 214.

The controller 212 may also receive signal responses from the embedded sensors 218 via the analog bus 214. The received signal responses may be analog measurements made on the circuit-under-test 216. For example, the received signal response may include DC measurements taken by the embedded sensors 218 from the circuit-under-test 216. The controller 212 may perform operations on the received signal responses. For example, the controller 212 may convert the received signal responses from analog measurements to digital measurements. The controller 212 may provide the received signal responses to the ATE 202 via the digital bus 220, the bus interface 224, and SBI_OUT 228.

Figure 3:
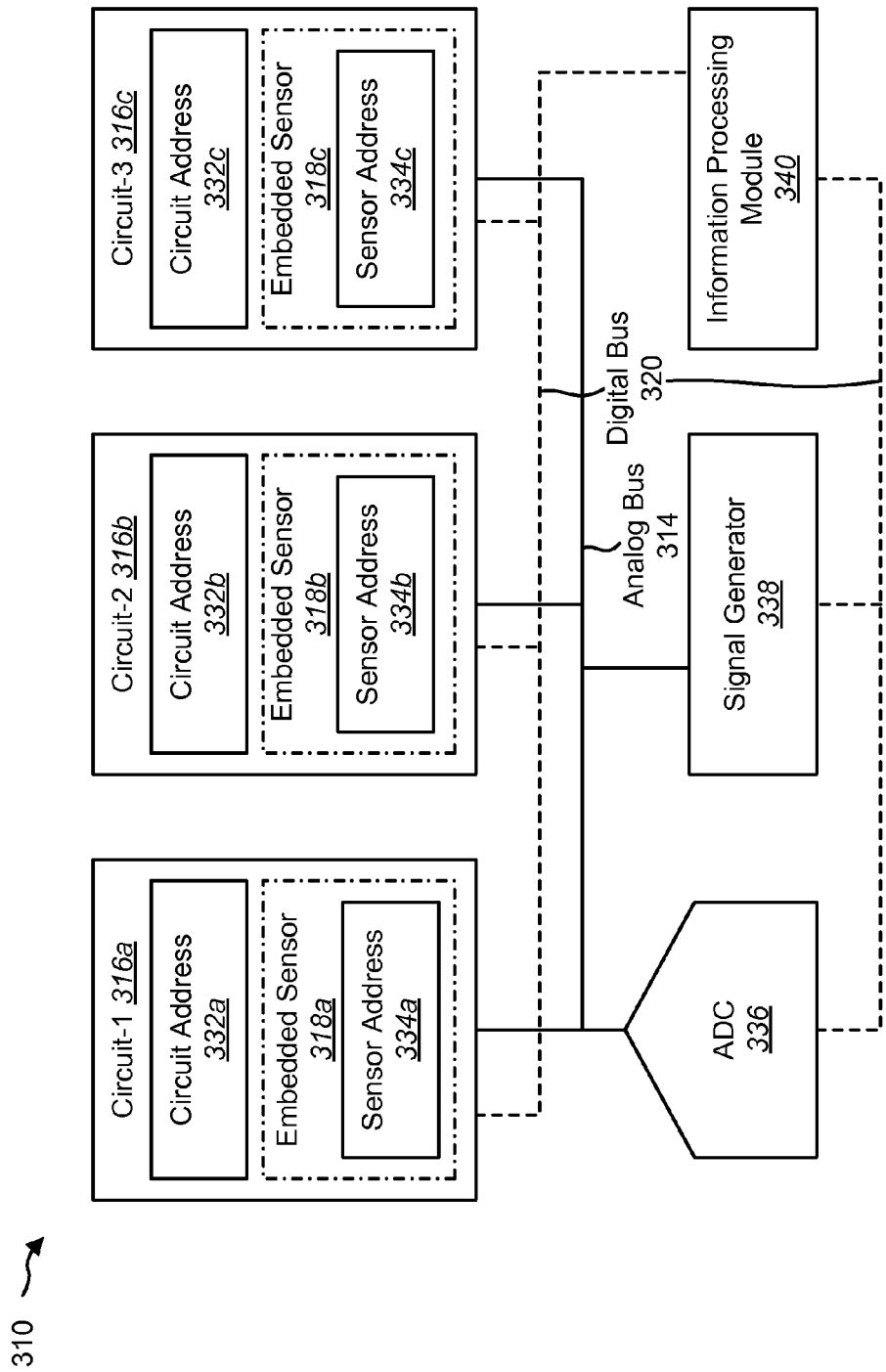
FIG. 3 is a block diagram illustrating a BiST system for use in the present methods and apparatus.

FIG. 3 is a block diagram illustrating a BiST system 310 for use in the present methods and apparatus. The BiST system 310 may include multiple integrated circuits 316a-c. Each integrated circuit 316 may have a circuit address 332a-c associated with the integrated circuit 316. The circuit addresses 332 may assist the BiST system 310 in differentiating between each integrated circuit 316a-c.

Each integrated circuit 316 may include one or more embedded sensors 318a-c. The embedded sensors 318 may interact with the integrated circuits 316. For example, the embedded sensors 318 may provide access to nodes within the integrated circuits 316. The embedded sensors 318 may allow an integrated circuit 316 to be probed and measurements to be taken of internal nodes within the integrated circuit 316. Each of the embedded sensors 318 may have a sensor address 334a-c associated with the embedded sensor 318. A sensor address 334 may assist the BiST system 310 in differentiating between each embedded sensor 318.

Each embedded sensor 318 may have one or more switches. Each switch may allow an embedded sensor 318 to communicate with an integrated circuit 316 at a different node. For example, when a first switch within an embedded sensor 318 is switched to the 'on' position, the embedded sensor 318 may probe the integrated circuit 316 at the integrated circuit node attached to the first switch. As another example, when a second switch within the embedded sensor 318 is switched to the 'on' position, the embedded sensor 318 may make measurements at the integrated circuit node attached to the second switch.

An embedded sensor 318 may receive instructions over a digital bus 320. The instructions may indicate which switches on the embedded sensor 318 are to be turned 'on' or 'off.' The switches on an embedded sensor 318 are discussed in more detail below in relation to FIGS. 9-11. An embedded sensor 318 may convert DC/RF measurements taken on an integrated circuit 316 to equivalent DC levels. In one configuration, an embedded sensor 318 may convert DC/RF measurements taken on an integrated circuit 316 to equivalent DC levels using an envelope detector. Envelope detectors are discussed in more detail below in relation to FIG. 9.

The BiST system 310 may include a signal generator 338. The signal generator 338 may be an existing RF synthesizer on the DUT 104. Thus, the signal generator 338 may generate signals on-die. The signal generator 338 may generate mixed signals for testing the integrated circuits 316. The generated mixed signals may perturb an integrated circuit 316 through an embedded sensor 318. The signal generator 338 may send the generated mixed signals to an embedded sensor 318 via an analog bus 314.

The BiST system 310 may include an analog-to-digital convertor (ADC) 336. The ADC 336 may be located on the DUT 104. For example, the ADC 336 may be a housekeeping ADC required on SoCs. The ADC 336 may receive measurements taken by the embedded sensors 318. The ADC 336 may receive these measurements after the measurements have been converted to equivalent DC levels using an envelope detector. Alternatively, the ADC 336 may receive the measurements directly without conversion. The ADC 336 may receive measurements taken by the embedded sensors 318 via the analog bus 314.

The BiST system 310 may include an information processing module 340. The information processing module 340 may be a finite state machine (FSM). The information processing module 340 may be located on the DUT 104. For example, the information processing module 340 may be embedded within the controller 212 of the BiST system 310. Alternatively, the information processing module 340 may be located externally. For example, the information processing module 340 may be located on an ATE 202.

The information processing module 340 may receive the measurements from the ADC 336. Because the ADC 336 has converted the measurements from analog to digital, the information processing module 340 may receive the measurements from the ADC 336 via the digital bus 320. The information processing module 340 may also communicate with the signal generator 338. For example, the information processing module 340 may set the signal generator 338 outputs to specific frequencies or adjust the amplitudes of the signals generated by the signal generator 338. The information processing module 340 may provide a digital interface for analog testing.

The information processing module 340 may use an existing Advanced RISC (reduced instruction set computing) Machine (ARM)/Joint Test Action Group (JTAG) core. JTAG refers to the Institute of Electrical and Electronics Engineers (IEEE) 1149.1 standard entitled Standard Test Access Port and Boundary-Scan Architecture. In the absence of an on-chip information processing module 340, an external tester with an appropriately configured software routine may be used with similar functionality as the information processing module 340.

Figure 4:
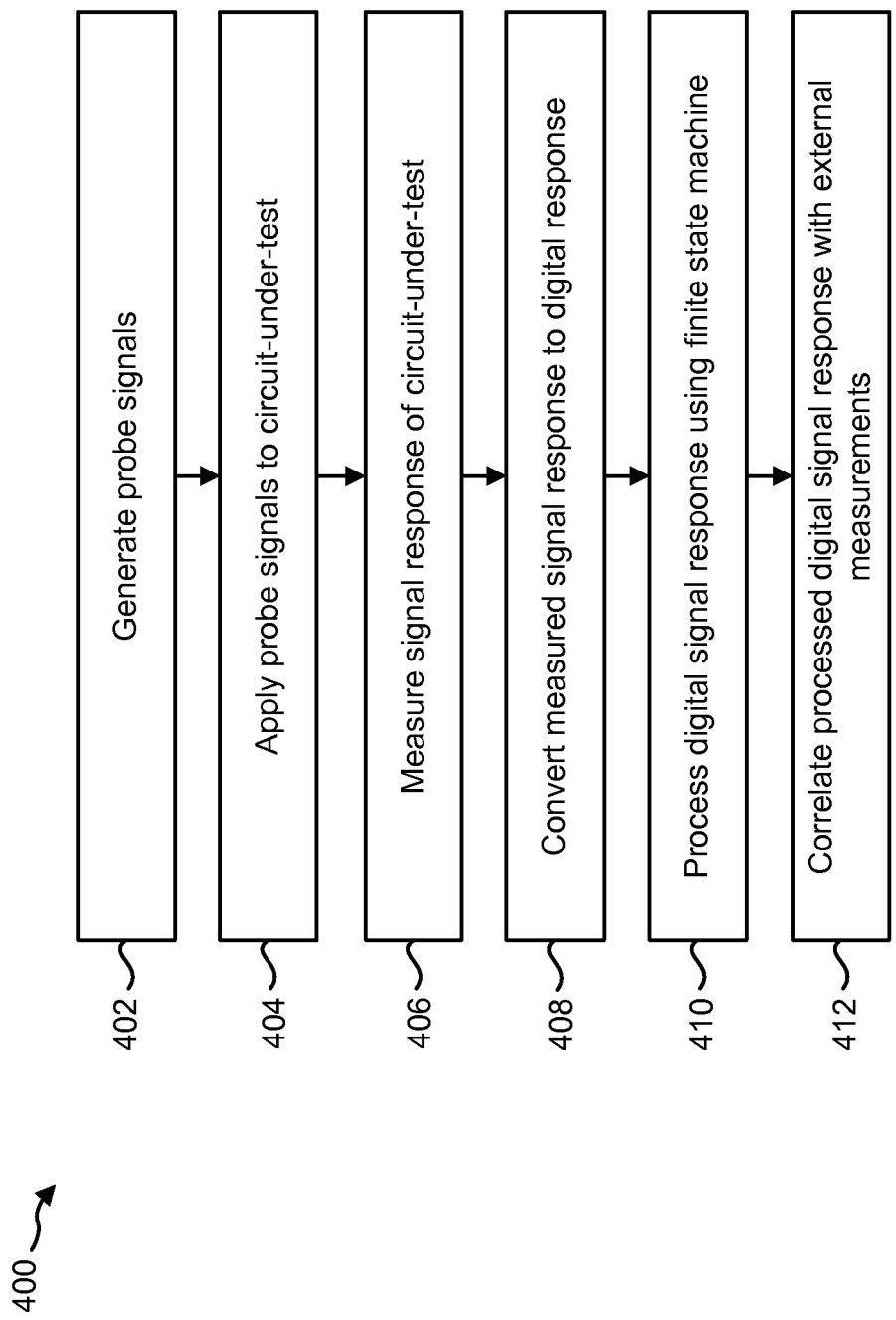
FIG. 4 is a flow diagram illustrating a method for providing a BiST of mixed signal integrated circuits.

FIG. 4 is a flow diagram illustrating a method 400 for providing a built-in self test (BiST) of mixed signal integrated circuits 316. A BiST system 310 may be located on a DUT 104. The BiST system 310 may provide testing of mixed signal integrated circuits 316 according to a testing procedure. The testing procedure may be defined by a user of the BiST system 310. A signal generator 338 may generate 402 probe signals. The probe signals may be generated according to the testing procedure. An embedded sensor 318 may apply 404 the probe signals to a circuit-under-test. The embedded sensor 318 may apply 404 the probe signals to the circuit-under-test using a switch in the embedded sensor. The circuit-under-test may be an integrated circuit 316. The circuit-under-test may be a mixed-signal circuit. The embedded sensor 318 may then measure 406 the signal response of the circuit-under-test.

An ADC 336 may convert 408 the measured signal response to a digital signal response. An FSM 340 may process 410 the digital signal response. The FSM 340 may then correlate 412 the processed digital signal response with external measurements. For example, the external measurements may be a relatively small number of off-chip measurements with a high level of accuracy. The off-chip measurements may be performed by an analog ATE 102. In contrast, the processed digital signal response of the measurements taken by the BiST system 310 represents a relatively large number of on-chip measurements with a lower level of accuracy. Using a statistical correlation, it can be determined whether the particular integrated circuit 316 passes or fails a certain figure of merit. Thus, it may be determined whether the DUT 104 can be shipped to customers.

Figure 5:
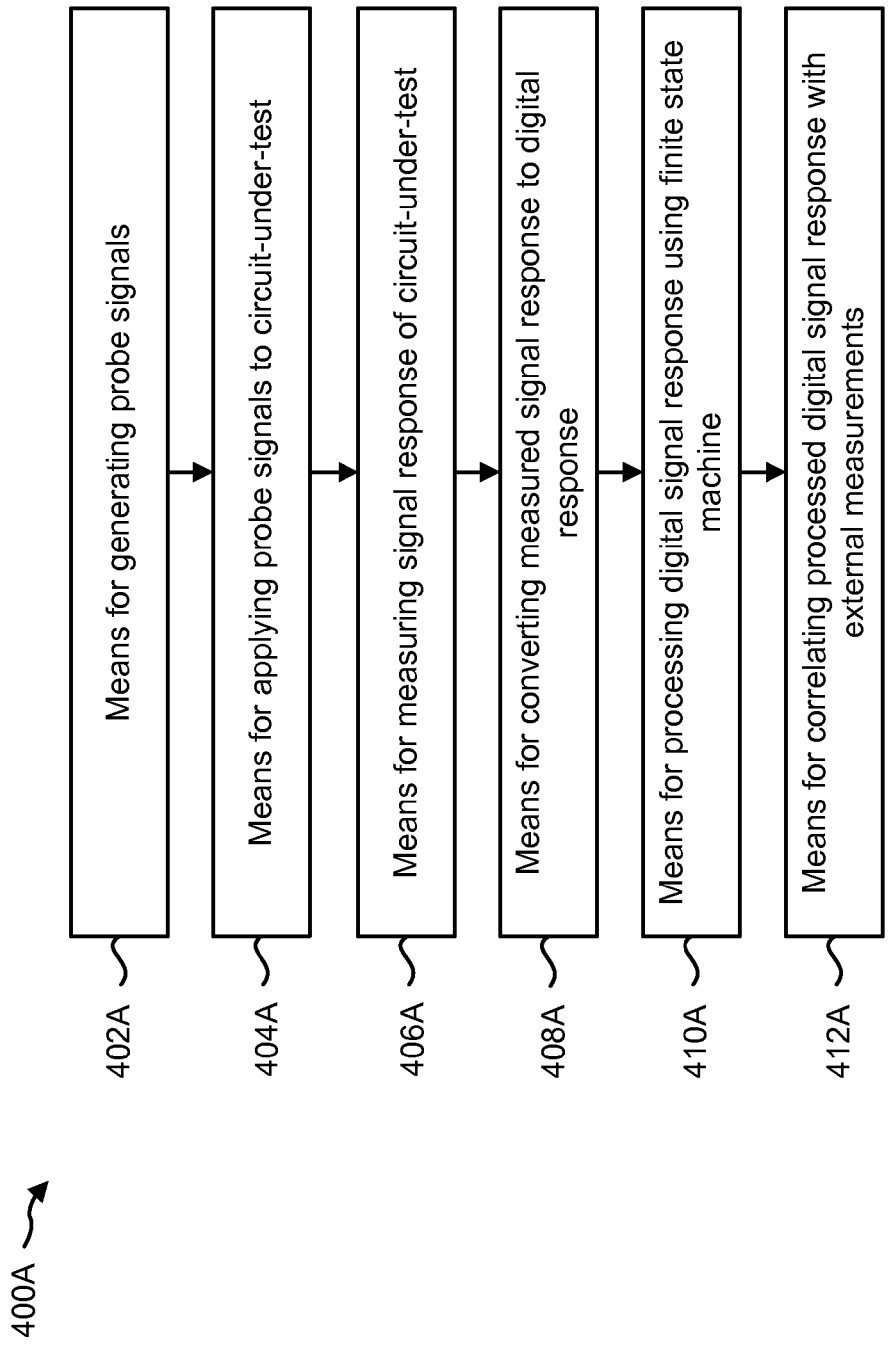
FIG. 5 illustrates means-plus-function blocks corresponding to the method of FIG. 4.

The method 400 of FIG. 4 described above may be performed by various hardware and/or software component(s) and/or module(s) corresponding to the means-plus-function blocks 400A illustrated in FIG. 5. In other words, blocks 402 through 412 illustrated in FIG. 4 correspond to means-plus-function blocks 402A through 412A illustrated in FIG. 5.

Figure 6:
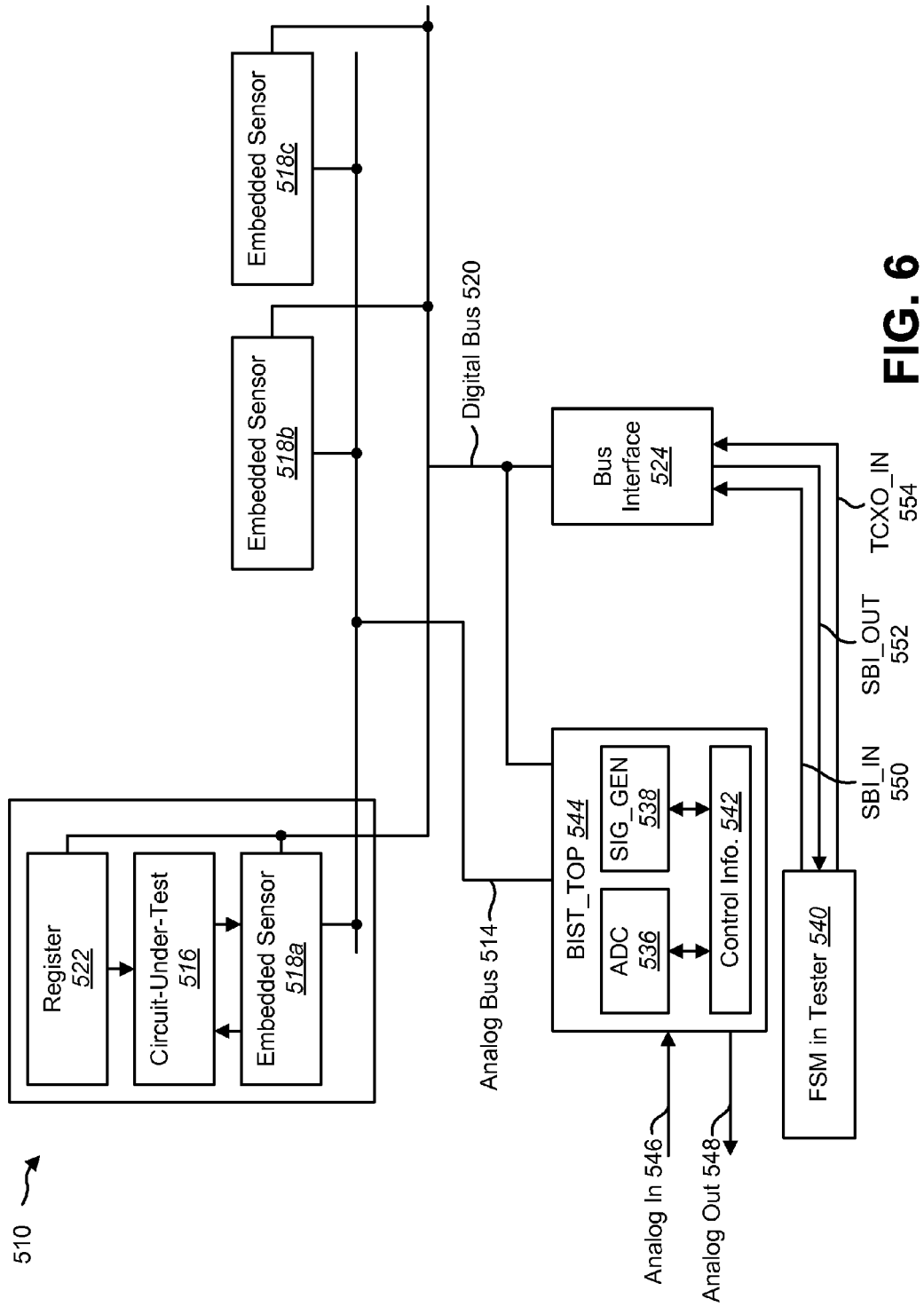
FIG. 6 is a block diagram illustrating a BiST system.

FIG. 6 is a block diagram illustrating a BiST system 510. The BiST system 510 may include a bus interface 524. The bus interface 524 may allow for external access to the BiST system 510 by an ATE 102 via a digital bus 520. The bus interface 524 may be a serial bus interface (SBI) slave. An FSM in the tester 540 may send communications to the bus interface 524 through an SBI_IN 550 input and receive communications from the bus interface 524 through an SBI_OUT 552 output. The FSM in the tester 540 may also input a clock signal to the BiST system 510. In one configuration, the FSM in the tester 540 may input a TCXO_IN 554 to the bus interface 524.

The BiST system 510 may include a central controller. The central controller may be referred to as BiST_TOP 544. The central controller may communicate with the bus interface 524 via a digital bus 520. The digital bus 520 may include address information, data, and clock (CLK) signals. The central controller may include control information 542 for the central controller. For example, the central controller may include control information 542 for controlling a signal generator 538 and an ADC 536. The central controller may include a signal generator 538. The signal generator 538 may generate analog and/or digital signals for probing a circuit-under-test 516. The central controller may also include an ADC 536. The controller may use the ADC 536 to convert received analog signals to digital signals for transmission to an external ATE 102.

The BiST_TOP 544 may receive analog in signals 546 and send analog out signals 548. The analog in and analog out signals 546, 548 may be used for debugging the BiST_TOP.

The central controller may communicate with one or more embedded sensors 518*a-c*. The central controller may communicate with the embedded sensors 518 via an analog bus 514. The analog bus 514 may also be referred to as the BiST bus. The central controller may send signals generated by the signal generator 538 to the embedded sensors 518 via the analog bus 514. The controller may also receive signal responses from the embedded sensors 518 via the analog bus 514. The controller may also communicate with the embedded sensors 518 via the digital bus 520. The central controller may send digital controls to the embedded sensors 518 via the digital bus 520.

The central controller may send digital controls to the embedded sensors 518 through a register 522. The register 522 may be an SBI register. The register 522 may store bits of information such that the information can be read out simultaneously. For example, the register 522 may include instructions for simultaneously opening and closing switches on the embedded sensors 518.

The embedded sensors 518 may provide an array of connections to various nodes on integrated circuits 516. Thus, an embedded sensor 518 may provide the ability to probe certain nodes on an integrated circuit 516 and simultaneously measure the response from other nodes on the integrated circuit 516. The array of sensors may convert all DC/RF measurements to equivalent DC levels. Because the measured parameter is a DC voltage, a low bandwidth ADC 536 may be sufficient for the measurements. Because the output of each embedded sensor 518 is a DC level, more sensors can be added to the array of sensors without adversely impacting the performance of the BiST system 510.

Figure 7:
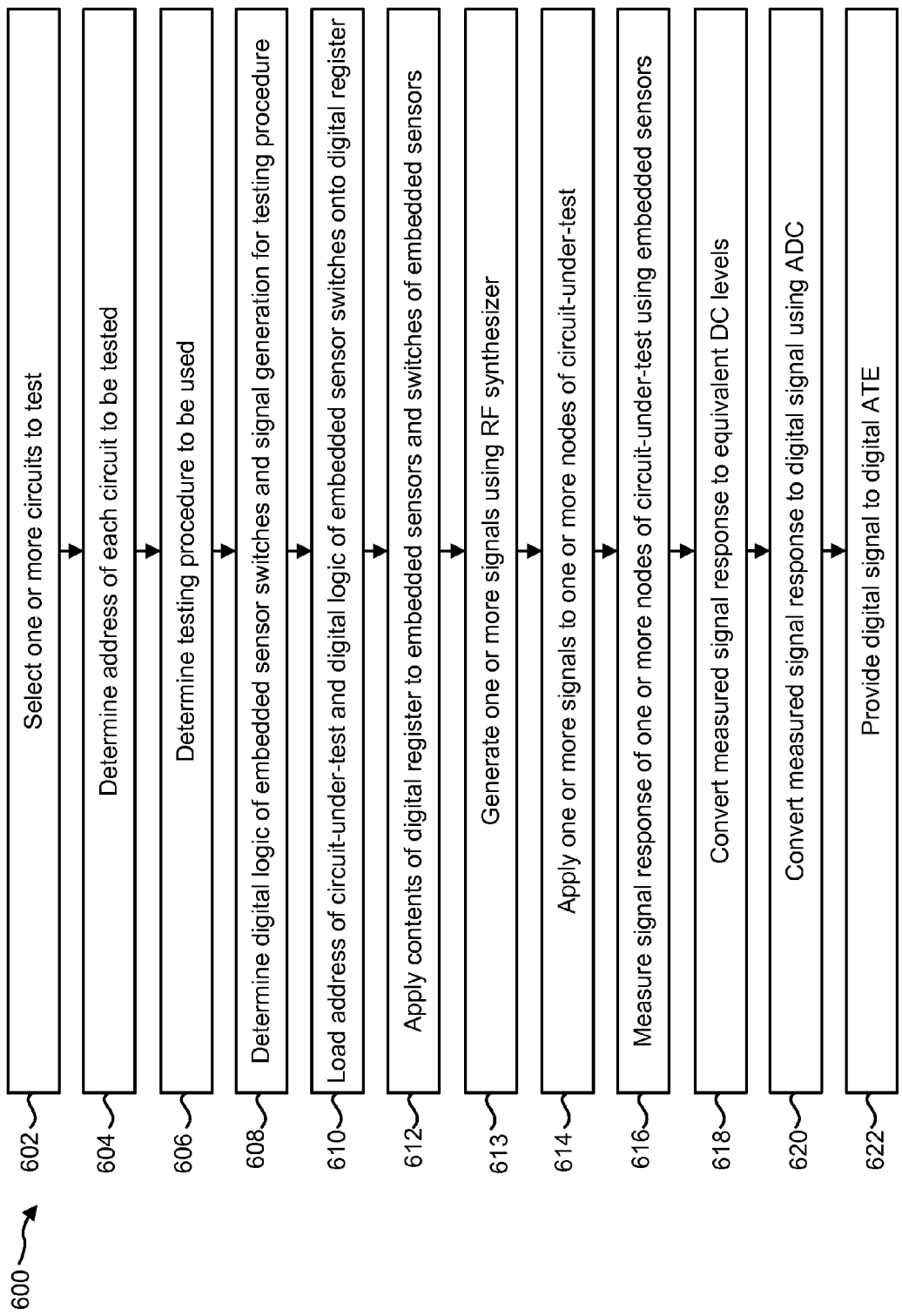
FIG. 7 is a flow diagram illustrating another method for providing a BiST of mixed signal circuitry.

FIG. 7 is a flow diagram illustrating another method 600 for providing a BiST of mixed signal circuitry. The method 600 may be performed by a BiST system 510. The BiST system 510 may first select 602 one or more integrated circuits 516 to be tested. For example, the BiST system 510 may select 602 the integrated circuits 516 for which a particular test is appropriate. The integrated circuits 516 to be tested may be selected by a central controller on the BiST system 510. Alternatively, the integrated circuits 516 to be tested may be selected by the ATE 102.

The BiST system 510 may determine 604 the address 332 of each integrated circuit 516 to be tested. The BiST system 510 may then determine 606 the testing procedure to be used. For example, testing procedures may include functional (or parametric) testing, power source current monitoring, direct current (DC) testing, and oscillating frequency testing.

The BiST system 510 may next determine 608 the digital logic of switches within embedded sensors 518 and the appropriate signal generation for the determined testing procedure. For example, a particular testing procedure may input a sinusoidal signal to a particular node within the circuit-under-test 516. Because an embedded sensor 518 may provide a connection to multiple nodes with the circuit-under-test 516, it is important that the generated signal only be applied to the appropriate nodes within the circuit-under-test 516. By instructing the embedded sensor 518 to open certain switches and close others, the signal generation can be applied to the appropriate nodes within the circuit-under-test 516. Each node within the circuit-under-test 516 receiving signal generation from the signal generator 538 may receive the same signal generation from the signal generator 538. Alternatively, each node within the circuit-under-test 516 receiving signal generation from the signal generator 538 may receive unique signals. For example, a first node within the circuit-under-test 516 may receive a square wave signal and a second node within the circuit-under-test 516 may receive a sinusoidal wave signal.

The BiST system 510 may load 610 the address 332 of the circuit-under-test 516 and the digital logic corresponding to each of the switches onto a register 522. For example, the register 522 may be a digital register such as an SBI register. The BiST system 510 may then apply 612 the contents of the register 522 to the embedded sensors 518 and/or the switches of the embedded sensors 518. The BiST system 510 may next generate 613 one or more signals using an RF synthesizer. The BiST system 510 may apply 614 the one or more signals to the one or more nodes of the circuit-under-test 516 using the embedded sensors 518. The embedded sensors 518 may measure 616 the signal response of one or more nodes of the circuit-under-test 516 using the embedded sensors 518. The embedded sensors 518 may convert 618 the measured signal response to equivalent DC levels. The embedded sensors 518 may convert 618 the measured signal response to equivalent DC levels using an envelope detector. Envelope detectors are discussed in more detail below in relation to FIG. 9.

The BiST system 510 may convert 620 the measured signal response to a digital signal using an ADC 536. The BiST system 510 may then provide 622 the digital signal to a digital ATE 102. The BiST system 510 may provide 622 the digital signal to the digital ATE 102 via the digital bus 520, the bus interface 524, and the SBI_OUT 552. Thus, outputs from the ADC 536 may be provided to the digital ATE 102 via the bus interface 524.

Figure 8:
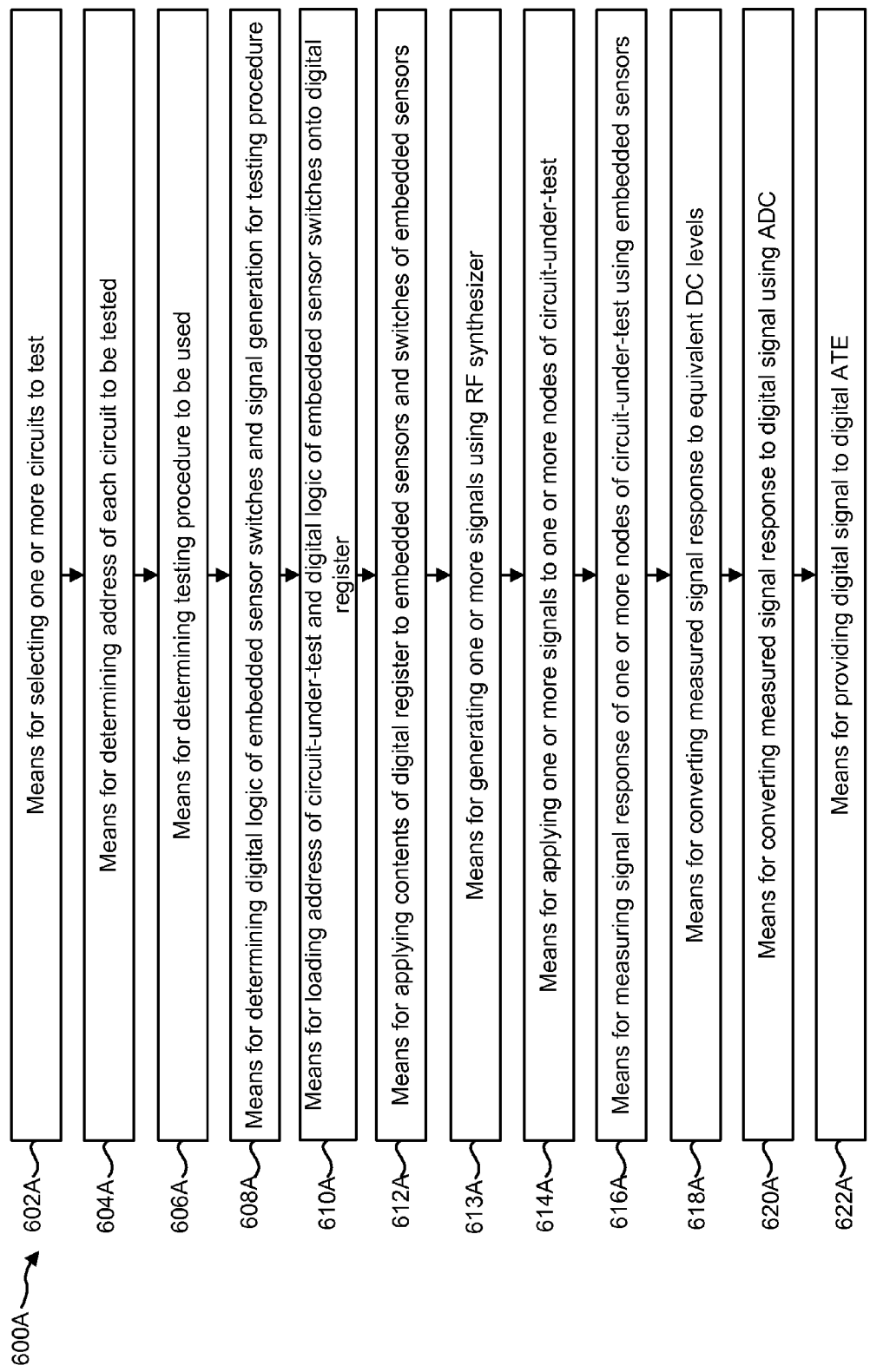
FIG. 8 illustrates means-plus-function blocks corresponding to the method of FIG. 7.

The method 600 of FIG. 7 described above may be performed by various hardware and/or software component(s) and/or module(s) corresponding to the means-plus-function blocks 600A illustrated in FIG. 8. In other words, blocks 602 through 622 illustrated in FIG. 7 correspond to means-plus-function blocks 602A through 622A illustrated in FIG. 8.

Figure 9:
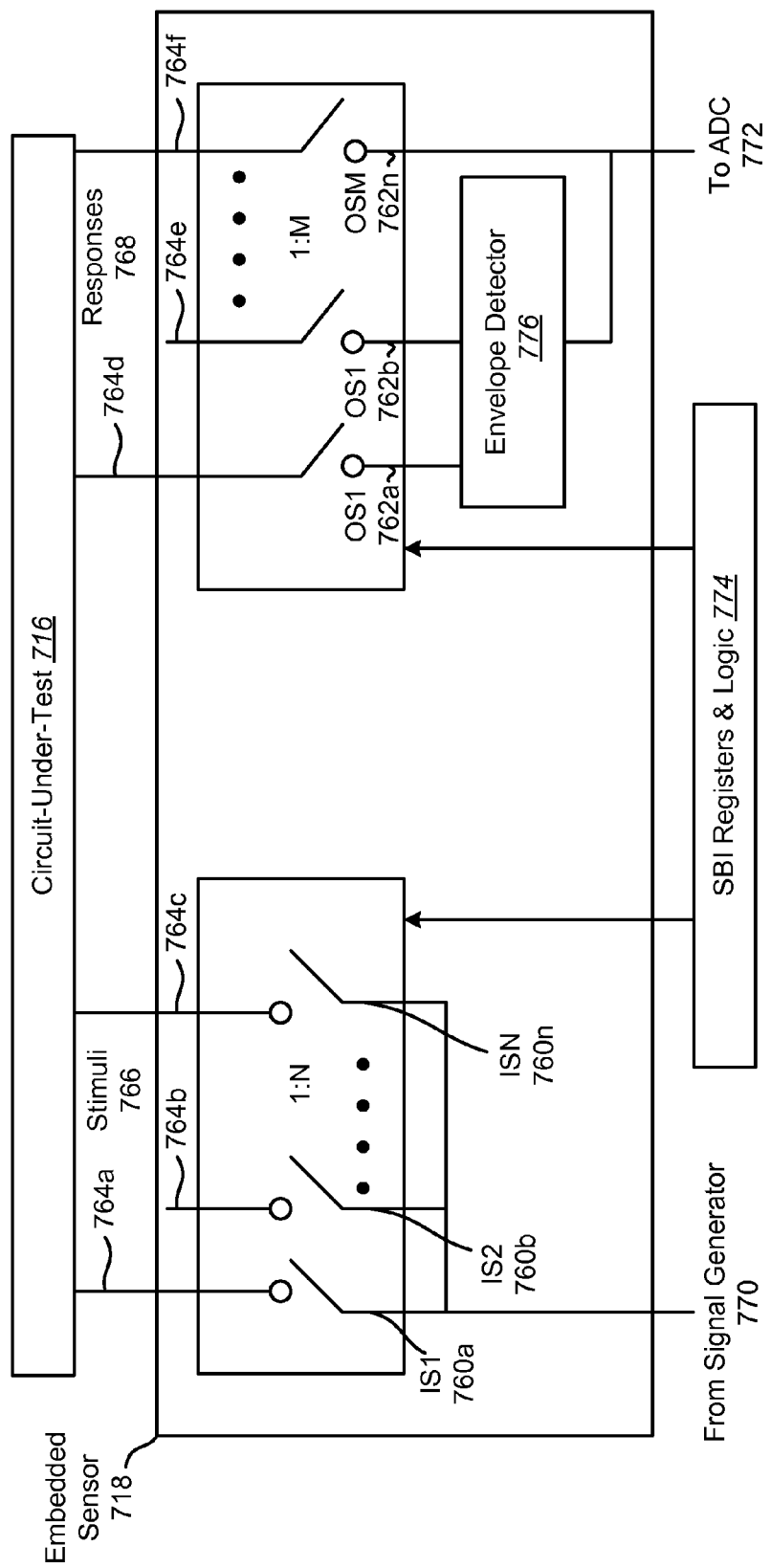
FIG. 9 is a block diagram illustrating an embedded sensor for use in the present methods and apparatus.

FIG. 9 is a block diagram illustrating an embedded sensor 718 for use in the present methods and apparatus. An embedded sensor 718 may include one or more switches. Each of the switches may provide a connection to a node 764 within a circuit-under-test 716. The switches are discussed in further detail below in relation to FIG. 11.

Each switch may have an address 334 associated with the switch. For example, a first switch 760a may have a first address IS1, a second switch 760b may have a second address IS2, and an Nth switch 760n may have an address ISN. A switch may provide stimuli 766 and/or receive responses 768 from nodes 764a-f within the circuit-under-test 716. In the figure, a first set of switches 760a-n is shown operating as stimuli 766 and a second set of switches 762a-n is shown operating to receive responses 768. However, a switch may be used for both stimulating the circuit-under-test 716 and receiving responses from the circuit-under-test 716. Alternatively, a different set of switches may be used for stimulating the circuit-under-test 716 than for receiving responses from the circuit-under-test 716.

A switch 760 used for stimulating the circuit-under-test 716 may be connected to the analog bus 514. A switch 760 may receive 770 stimulus signals from a signal generator 538 via the analog bus 514. If the switch 760 is in the closed or 'on' position, the switch 760 may apply the stimulus signals to a node 764 within the circuit-under-test 716. If the switch 760 is in the open or 'off' position, the switch 760 may refrain from applying the stimulus signals to a node 764 within the circuit-under-test 716.

A switch may be connected to the digital bus 520. The digital bus 520 may allow each switch to receive instructions from a register 522. For example, an SBI register 774 may instruct some of the switches to operate in the open or 'off' position while simultaneously instructing other switches to operate in the closed or 'on' position.

A switch 762 used for receiving signal responses 768 from the circuit-under-test 716 may also be connected to the analog bus 514. A switch 762 used for receiving responses 768 from the circuit-under-test 716 may receive a signal response 768 from a node 764 within the circuit-under-test 716. If the switch 762 is in the closed or 'on' position, the switch 762 may send the signal response 768 to an envelope detector 776. An envelope detector 776 may receive a signal response with an input amplitude, and the envelope detector 776 may output a DC voltage. The envelope detector 776 may thus perform the step of converting a measured signal response 768 to equivalent DC levels, as discussed above in relation to FIG. 7. The output of the envelope detector 776 may then be sent 772 to an ADC 536 via the analog bus 514.

In one configuration, one or more of the switches 762 may bypass the envelope detector 776. For example, the switch 762n used for receiving signal responses 768 from the circuit-under-test 716 referred to as OSM may send 772 received signal responses 768 directly to the ADC 536 via the analog bus 514, provided that the switch 762n is in the closed or 'on' position.

Figure 10:
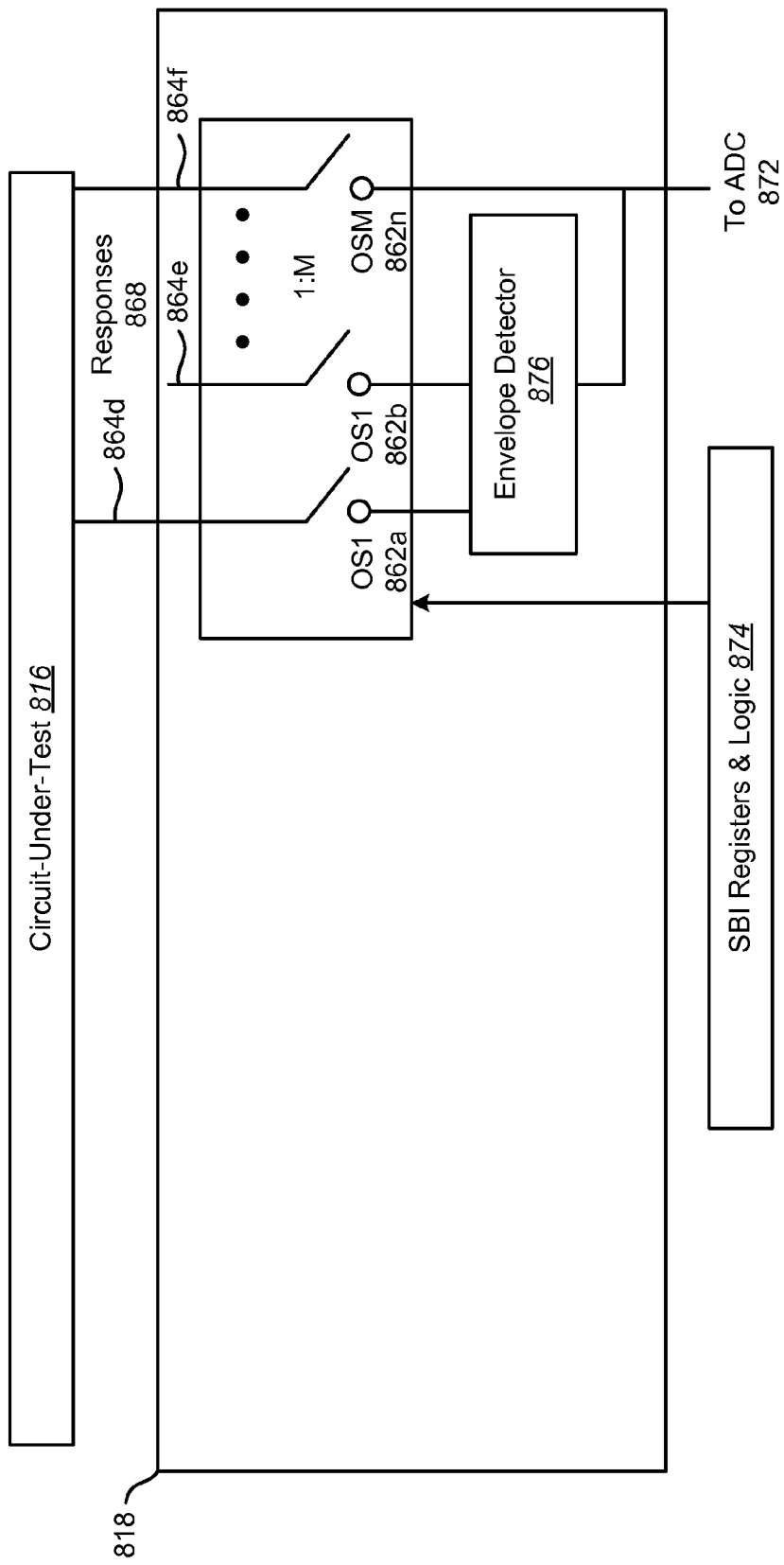
FIG. 10 is a block diagram illustrating another embedded sensor for use in the present methods and apparatus.

FIG. 10 is a block diagram illustrating another embedded sensor 818 for use in the present methods and apparatus. An embedded sensor 818 may include one or more switches 862a-n for receiving signal responses 868 from a circuit-under-test 816. The switches 862 may be connected to a digital bus 520. The digital bus 520 may allow each of the switches 862 to receive instructions and digital logic from a register 874. For example, an SBI register may instruct some of the switches 862 to operate in the open or 'off' position while simultaneously instructing other switches 862 to operate in the closed or 'on' position.

Each switch 862 may also be connected to an analog bus 514. A switch 862 may receive signal responses 868 from a node 864d-f within the circuit-under-test 816. If the switch 862 is in the closed or 'on' position, the switch 862 may send the signal responses to an envelope detector 876 for conversion of the measured signal response to equivalent DC levels. The output of the envelope detector 876 may then be sent 872 to an ADC 536 via the analog bus 514. Alternatively, the switches 862 may bypass the envelope detector 876 by sending 872 the measured signal response directly to the ADC 536 via the analog bus 514. If a switch 862 is in the open or 'off' position, the switch 862 may not relay received signal responses 868 to the analog bus 514.

Figure 11:
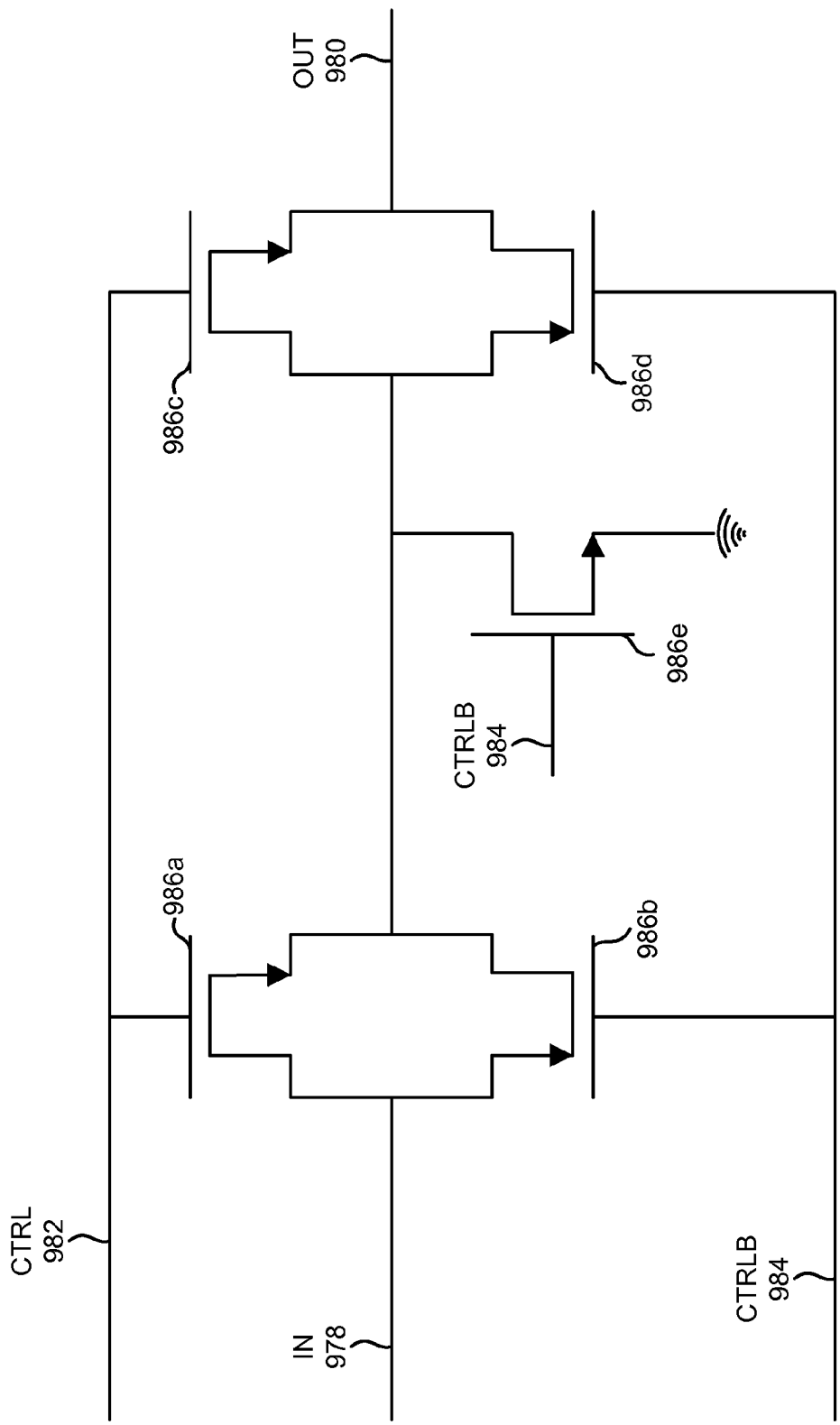
FIG. 11 is a circuit diagram illustrating a switch for use in an embedded sensor.

FIG. 11 is a circuit diagram illustrating a switch for use in an embedded sensor 718. The switch may have an input IN 978 and an output OUT 980. In one configuration, the input IN 978 may be tied to a circuit-under-test 716 and the output OUT 980 may be tied to an envelope detector 776. In another configuration, the input IN 978 may be tied to an analog bus 514 and the output OUT 980 may be tied to a circuit-under-test 716.

The switch may receive digital control signals CTRL 982 and CTRLB 984. CTRLB 984 may be complementary with CTRL 982 such that when CTRL 982 has a high voltage, CTRLB 984 has a low voltage and when CTRL 982 has a low voltage, CTRLB 984 has a high voltage. CTRL 982 and CTRLB 984 may be received by the switch from a register 522 via the digital bus 520. The switch may also include multiple transistors 986a-e connected between CTRL 982 and CTRLB 984 in a low resistance path. When CTRL 982 is raised to a high voltage, CTRLB 984 has a corresponding low voltage. Thus, when CTRL 982 is raised to a high voltage, transistors 986a and 986c are in the closed or 'on' position and the input IN 978 signal flows to the output OUT 980. Likewise, when CTRLB 984 has a low voltage, transistors 986b and 986d are in the closed or 'on' position and the input IN 978 signal flows to the output OUT 980. When CTRLB 984 has a high voltage and CTRL 982 has a low voltage, transistors 986a-d are in the open or 'off' position and there is no conduction between the input IN 978 and the output OUT 980 and thus no signal flows from IN 978 to OUT 980.

The switch may include an NMOS transistor 986e tied between an internal node of the switch and ground. The transistor 986e may be used to pull the internal node to ground. If routing a high frequency signal from IN 978 to OUT 980, it may be necessary that there is zero coupling between IN 978 and OUT 980 when the transistors 986a-d are in the open or 'off' position. Thus, even if there is a feedthrough signal through the transistors 986a and 986b to the internal node when the transistors 986a and 986b are closed, the feedthrough signal will be sent to ground. In other words, transistor 986e will be closed or 'on' whenever CTRLB 984 is high and CTRL 982 is low.

Figure 12:
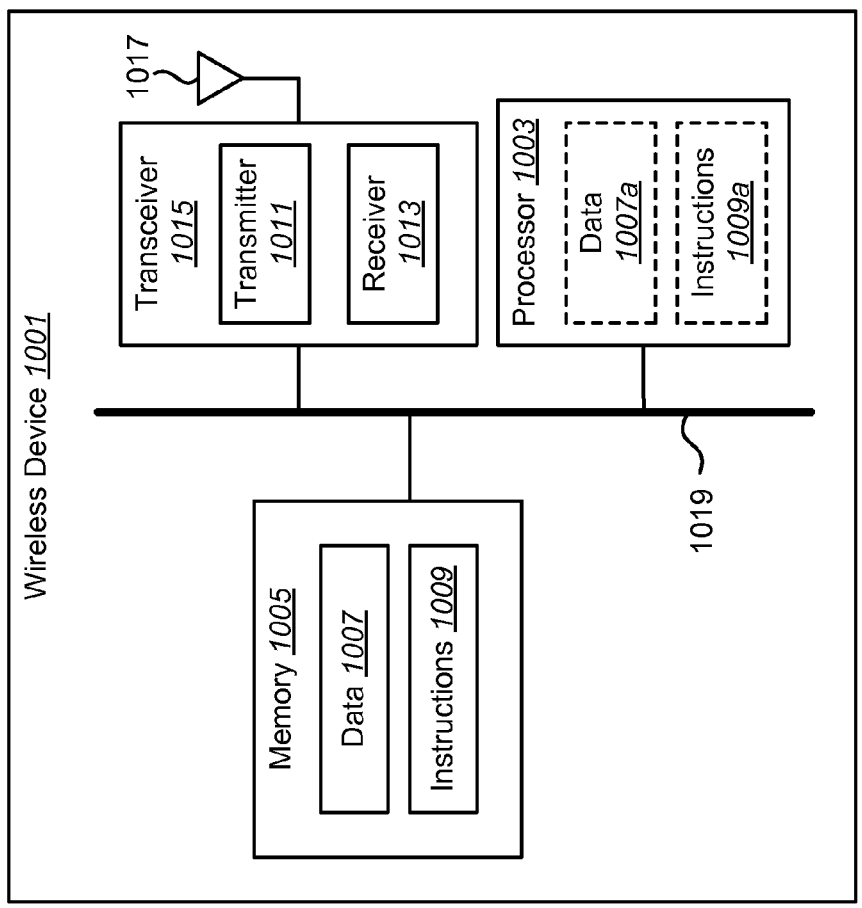
FIG. 12 is a block diagram illustrating certain components that may be included within a wireless device that is configured in accordance with the present disclosure.

FIG. 12 illustrates certain components that may be included within a wireless device 1001. The wireless device 1001 may be a mobile device/station or a base station. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1001. Additionally, the present systems and methods may be used on an integrated circuit 106 that may be an electronic device that is not a wireless device 1001. However, the electronic device block diagram and components would be similar to the wireless device 1001 of FIG. 12 except that the electronic device may not have a transceiver 1015.

The wireless device 1001 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless device 1001 of FIG. 12, in an alternative configuration, a combination of processors (e.g., an ARM and DSP) could be used.

The wireless device 1001 also includes memory 1005. The memory 1005 may be any electronic component capable of storing electronic information. The memory 1005 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1007 and instructions 1009 may be stored in the memory 1005. The instructions 1009 may be executable by the processor 1003 to implement the methods disclosed herein. Executing the instructions 1009 may involve the use of the data 1007 that is stored in the memory 1005. When the processor 1003 executes the instructions 1009, various portions of the instructions 1009a may be loaded onto the processor 1003, and various pieces of data 1007a may be loaded onto the processor 1003.

The wireless device 1001 may also include a transmitter 1011 and a receiver 1013 to allow transmission and reception of signals to and from the wireless device 1001. The transmitter 1011 and receiver 1013 may be collectively referred to as a transceiver 1015. An antenna 1017 may be electrically coupled to the transceiver 1015. The wireless device 1001 may also include (not shown) multiple transmitters, multiple receivers, multiple transceivers and/or multiple antenna.

The various components of the wireless device 1001 may be coupled together by one or more buses, which may include a power bus, a control signal bus, a status signal bus, a data bus, etc. For the sake of clarity, the various buses are illustrated in FIG. 12 as a bus system 1019.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4 and 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A built-in self test (BiST) system, comprising:
   a circuit-under-test;
   one or more embedded sensors, wherein each of the embedded sensors comprises one or more switches connected to one or more nodes within the circuit-under-test, wherein measurements taken on the circuit-under-test are sent from a switch to an envelope detector that converts the measurements to equivalent direct current (DC) levels;
   a signal generator; and
   a bus interface, wherein the bus interface provides for external access of the BiST system.

2. The BiST system of claim 1, further comprising an on-chip analog-to-digital converter (ADC).

3. The BiST system of claim 2, wherein outputs from the ADC are provided to automatic test equipment (ATE) via the bus interface.

4. The BiST system of claim 2, wherein the switch provides a connection between a node within the circuit-under-test and the ADC.

5. The BiST system of claim 4, wherein a measurement is taken of the node within the circuit-under-test when the switch is in the closed or 'on' position.

6. The BiST system of claim 4, wherein each embedded sensor further comprises an envelope detector between the switch and the ADC.

7. The BiST system of claim 1, wherein a switch provides a connection between the signal generator and a node within the circuit-under-test.

8. The BiST system of claim 7, wherein a signal generated by the signal generator is applied to the node within the circuit-under-test when the switch is in the closed or 'on' position.

9. The BiST system of claim 1, wherein the switches are controlled by a register.

10. The BiST system of claim 1, further comprising an analog bus.

11. The BiST system of claim 1, further comprising a digital bus.

12. A method for providing a built-in self test (BiST), comprising:
    measuring a signal response of a circuit-under-test using a first switch in an embedded sensor, wherein the embedded sensor comprises one or more switches connected to one or more nodes within the circuit-under-test, wherein the measuring comprises the first switch sending the signal response to an envelope detector that converts the measured signal response to equivalent direct current (DC) levels;
    converting the equivalent DC levels to a digital signal using an analog-to-digital converter (ADC); and
    providing the digital signal to automatic testing equipment (ATE).

13. The method of claim 12, further comprising:
    determining a testing procedure for the circuit-under-test;
    generating a probe signal according to the testing procedure; and
    applying the probe signal to the circuit-under-test using a second switch in the embedded sensor.

14. The method of claim 13, further comprising:
    selecting a circuit as the circuit-under-test;
    determining an address for the circuit-under-test;
    loading the address for the circuit-under-test into a register; and
    applying contents of the register to the embedded sensor on the circuit-under-test.

15. The method of claim 13, further comprising:
    determining digital logic for the one or more switches, wherein the digital logic comprises instructions for opening or closing each of the one or more switches;
    loading the digital logic into a register; and
    applying the digital logic to the one or more switches.

16. The method of claim 12, further comprising processing the digital signal using a finite state machine.

17. The method of claim 16, further comprising correlating the processed digital signal with external measurements.

18. The method of claim 12, wherein the digital signal is provided to the ATE via a digital bus and a bus interface.

19. The method of claim 13, wherein the probe signal is applied to the circuit-under-test via an analog bus.

20. The method of claim 13, wherein the probe signal is generated using a radio frequency (RF) synthesizer.

21. The method of claim 12, wherein the ATE is a digital ATE.

22. A wireless device configured for providing a built-in self test (BiST), comprising:
    a processor;
    memory in electronic communication with the processor;
    instructions stored in the memory, the instructions being executable by the processor to:
        measure a signal response of a circuit-under-test using a first switch in an embedded sensor, wherein the embedded sensor comprises one or more switches connected to one or more nodes within the circuit-under-test wherein the measuring comprises the first switch sending the signal response to an envelope detector that converts the measured signal response to equivalent direct current (DC) levels;
        convert the equivalent DC levels to a digital signal using an analog-to-digital converter (ADC); and
        provide the digital signal to automatic testing equipment (ATE).

23. The wireless device of claim 22, wherein the instructions are further executable to:
    determine a testing procedure for the circuit-under-test;
    generate a probe signal according to the testing procedure; and
    apply the probe signal to the circuit-under-test using a second switch in the embedded sensor.

24. The wireless device of claim 23, wherein the instructions are further executable to:
    select a circuit as the circuit-under-test;
    determine an address for the circuit-under-test;
    load the address for the circuit-under-test into a register; and
    apply contents of the register to an embedded sensor on the circuit-under-test.

25. The wireless device of claim 23, wherein the instructions are further executable to:
    determine digital logic for the one or more switches, wherein the digital logic comprises instructions for opening or closing each of the one or more switches;
    load the digital logic into a register; and
    apply the digital logic to the one or more switches.

26. The wireless device of claim 22, wherein the instructions are further executable to process the digital signal using a finite state machine.

27. The wireless device of claim 26, wherein the instructions are further executable to correlate the processed digital signal with external measurements.

28. The wireless device of claim 22, wherein the digital signal is provided to the ATE via a digital bus and a bus interface.

29. The wireless device of claim 23, wherein the probe signal is applied to the circuit-under-test via an analog bus.

30. The wireless device of claim 23, wherein the probe signal is generated using a radio frequency (RF) synthesizer.

31. The wireless device of claim 22, wherein the ATE is a digital ATE.

32. An apparatus for providing a built-in self test (BiST), comprising:
    means for measuring a signal response of a circuit-under-test using a first switch in an embedded sensor, wherein the embedded sensor comprises one or more switches connected to one or more nodes within the circuit-under-test, wherein the means for measuring comprises a means for envelope detection that receives the signal response via the first switch and converts means for converting the measured signal response to equivalent direct current (DC) levels;
    means for converting the equivalent DC levels to a digital signal using an analog-to-digital converter (ADC); and
    means for providing the digital signal to automatic testing equipment (ATE).

33. A computer-program product for a wireless device configured for providing a built-in self test (BiST), the computer-program product comprising a non-transitory computer-readable storage medium having instructions thereon, the instructions comprising:
    code for measuring a signal response of a circuit-under-test using a first switch in an embedded sensor, wherein the embedded sensor comprises one or more switches connected to one or more nodes within the circuit-under-test, wherein the code for measuring comprises code for detecting an envelope of the signal response received via the first switch and code for converting the measured signal response to equivalent direct current (DC) levels;

code for converting the equivalent DC levels to a digital signal using an analog-to-digital converter (ADC); and
code for providing the digital signal to automatic testing equipment (ATE).

\* \* \* \* \*